United States Patent [19]

Mochizuki et al.

[11] Patent Number: 5,017,517
[45] Date of Patent: May 21, 1991

[54] METHOD OF FABRICATING SEMICONDUCTOR DEVICE USING AN SB PROTECTION LAYER

[75] Inventors: Kazuhiro Mochizuki, Kodaira; Tomonori Tanoue, Ebina; Chushirou Kusano, Tokorozawa; Hiroshi Masuda, Hachioji; Katsuhiko Mitani, Kokubunji, all of Japan

[73] Assignee: Hitachi, Ltd., Tokyo, Japan

[21] Appl. No.: 518,035

[22] Filed: May 2, 1990

[30] Foreign Application Priority Data

May 10, 1989 [JP] Japan .................. 01-115099

[51] Int. Cl.⁵ .................................... H01L 21/20
[52] U.S. Cl. .................... 437/90; 148/DIG. 5; 148/DIG. 26; 148/DIG. 11; 357/34; 357/55; 437/31; 437/40; 437/126; 437/945
[58] Field of Search .......... 148/DIG. 5, 15, 26, 148/25, 50, 56, 65, 72, 11, 53, 97, 110, 119, 169, 33, 33.1, 33.2, 33.4; 156/610–614, 644, 662, 649; 357/16, 23.1, 34, 35, 47, 49, 56, 55; 437/3, 32, 33, 40, 41, 61, 63, 67, 68, 81, 89, 90, 95, 96, 99, 105, 107, 126, 133, 936, 945, 946, 939

[56] References Cited

U.S. PATENT DOCUMENTS

| | | | |
|---|---|---|---|
| 3,760,492 | 9/1973 | Middelhoek et al. | 437/81 |
| 4,207,122 | 6/1980 | Goodman | 437/133 |
| 4,663,831 | 5/1987 | Birrittella et al. | 437/89 |
| 4,703,554 | 11/1987 | Havemann | 437/31 |
| 4,728,624 | 3/1988 | Silvestri et al. | 437/90 |
| 4,745,085 | 5/1988 | Shieh | 437/133 |
| 4,751,195 | 6/1988 | Kawai | 437/133 |
| 4,824,799 | 4/1989 | Komatsu | 437/90 |
| 4,829,016 | 5/1989 | Neudeck | 437/31 |
| 4,851,362 | 7/1989 | Suzuki | 437/31 |

FOREIGN PATENT DOCUMENTS

| | | | |
|---|---|---|---|
| 55-0019806 | 2/1980 | Japan . | |
| 59-0186368 | 10/1984 | Japan | 437/89 |
| 61-0220463 | 9/1986 | Japan | 437/31 |
| 62-49659 | 3/1987 | Japan . | |
| 63-0215070 | 9/1988 | Japan | 437/31 |
| 63-0255914 | 10/1988 | Japan . | |
| 64-0111372 | 4/1989 | Japan | 437/31 |

OTHER PUBLICATIONS

Evans et al., "Protective Overlayer Techniques for Preparation of InSb(001) Surfaces", Surf. Sci., vol. 226, No. 1-2, Feb. 1990, pp. 169–179.

Primary Examiner—Olik Chaudhuri
Assistant Examiner—William D. Bunch
Attorney, Agent, or Firm—Kenyon & Kenyon

[57] ABSTRACT

A method for fabricating a semiconductor device comprises the steps of forming the first semiconductor layer on a semiconductor substrate, forming a surface protection layer of antimony (Sb) or the material having Sb as its main component, executing the other steps necessary for the fabrication of the semiconductor device, removing the surface protection layer, and forming, on the first semiconductor layer thus exposed, the second semiconductor layer.

23 Claims, 3 Drawing Sheets

METHOD OF FABRICATING SEMICONDUCTOR DEVICE USING AN SB PROTECTION LAYER

BACKGROUND OF THE INVENTION

The present invention relates to a method for fabricating a semiconductor device, and more particularly to a method for selectively epitaxially growing semiconductors.

A previously known method for fabricating a semiconductor device comprises the steps of epitaxially growing a semiconductor layer on a semiconductor substrate, in an apparatus for epitaxial growth, taking out the semiconductor substrate from the epitaxial growth apparatus, executing some steps required for fabricating devices such as lithography and etching, and epitaxially re-growing another semiconductor layer. Such a method is indispensable for fabricating a semiconductor device because it can increase the freedom in fabricating the semiconductor device. On the surface of the semiconductor layer to be seed crystal when the semiconductor layer is epitaxially regrown, however, impurities such as oxygen and carbon deposit during the steps of the photolithography and etching, or defects such as dislocations occur. Thus, the crystalline quality of the interfaces between semiconductor layers after the regrowth of the semiconductor will generally deteriorate.

In order to solve such a problem, disclosed is in JP-A-62-49659 a method for fabricating a semiconductor device comprising the steps of forming a surface protection layer of indium arsenide (InAs) on the surface of a GaAs layer epitaxially grown on the semiconductor substrate, taking out the semiconductor substrate from the epitaxial growth apparatus, executing the steps of the photolithography and the ion-implantation of $O_2$, removing the surface protection layer, and epitaxially regrowing the GaAs layer.

SUMMARY OF THE INVENTION

However the above prior part technique has the following disadvantages. It takes a long time to remove the surface protection layer of InAs since the evaporation speed of InAs is relatively low. This is a fatal disadvantage for fabrication of semiconductor devices. Further, where the lattice constant and thermal expansion coefficient of the underlying semiconductor are different from those of InAs, defects such as strains and dislocations will occur. Furthermore, the above reference does not disclose a technique comprising the steps of forming a surface protection layer on a semiconductor layer, selectively forming a film such as an insulator layer with a predetermined opening pattern on the surface protection layer, selectively removing part of the surface protection layer which is exposed and epitaxially regrowing another semiconductor layer on the semiconductor layer grown.

An object of the present invention is to provide a method for fabricating a semiconductor device having excellent crystalline quality of interfaces between grown semiconductor layers after the re-growth of semiconductor material and so more excellent performance.

In order to attain the above object, the surface protection layer of antimony (Sb) and material having Sb as a main component is used.

DESCRIPTION OF THE PREFERRED EMBODIMENTS

Prior to explaining several embodiments of the present invention, its general concept will be explained. The material to be used for the surface protection layer is desired to be able to uniformly cover an underlying semiconductor layer, to be supplied as a raw material to an apparatus for growing semiconductors and electrically inactive even when it is mixed into the semiconductor grown layer. From this standpoint, several investigations were made for the material optimum for the surface protection layer. As a result, it was found that antimony is optimum as a material of the surface protection layer to be formed on the underlying semiconductor layer of particularly III-V compound semiconductor and their alloys.

This is based on the following discovery. After GaAs has been grown on a GaAs substrate at 600° C. by molecular beam epitaxy, molecular beams of antimony (Sb) were radiated to the substrate at the lowered temperature of 100° C. Then, amorphous antimony deposits on the grown GaAs layer which was confirmed by the electron diffraction measurement. The surface of this amorphous Sb layer is so flat that its film thickness can be controlled with precision of one atomic layer or so. The amorphous Sb layer was deposited to the thickness of about 500 Å and subjected to the electron beam diffraction measurement raising the temperature. As a result, the Sb layer becomes polycrystalline and was entirely evaporated at about 560° C. to form the diffraction pattern of clean GaAs. Sb does not entirely remain on the surface; this was confirmed by Auger electron spectroscopy.

Further, the material having Sb as its main component such a an alloy film of Sb and As, or Sb and P has the same characteristic as Sb.

Several embodiments of the present invention will be explained below.

EMBODIMENT 1

FIGS. 1A to 1F show the sectional structures in the process for fabricating a hetero-junction bipolar transistor according to the first embodiment of the present invention.

Figure 1A:
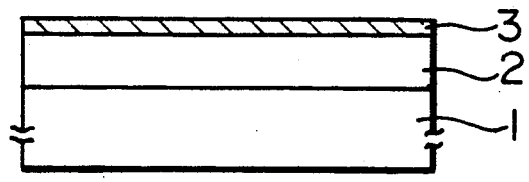
FIG. 1A to 1F are sectional views of the steps in a method for fabricating a hetero-junction bipolar transistor according to the first embodiment of the present invention.

First, formed on a semi-insulative GaAs substrate 1 at the temperature of about 600° C. by the molecular beam epitaxy is a Si-highly doped n-type GaAs layer 2 (the impurity concentration:$5 \times 10^{18}$ cm$^{-3}$) having a thickness of 5000 Å. Deposited thereon at the growing temperature lowered to 150° C. or lower is an amorphous Sb layer 3 having a maximum thickness of 1000 Å (500 Å in this embodiment) (FIG. 1A).

Figure 1E:
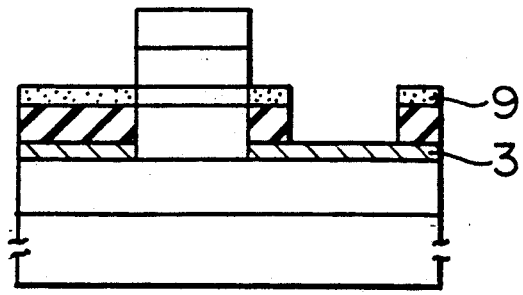
Figure 1B:
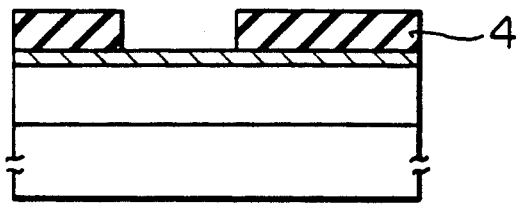
Figure 1F:
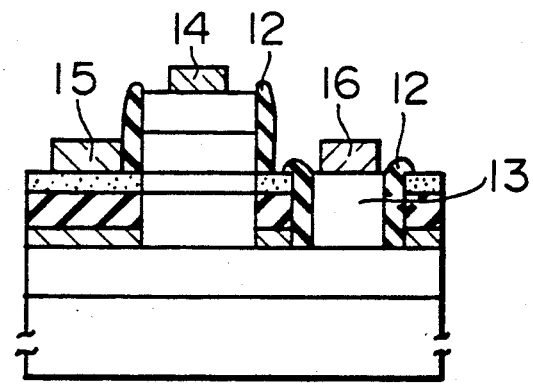

An SiO$_2$ film 4 having a thickness of 3500 Å is deposited by CVD, and part of the SiO$_2$ film where a heterojunction bipolar transistor is to be formed is removed by photolithography and etching (FIG. 1B).

Figure 1C:
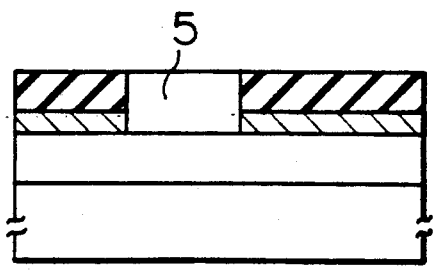

The sample is accommodated in an apparatus for metal organic chemical vapor deposition (MOCVD) and heated at the temperature of 560° C. or higher to evaporate the Sb layer the surface of which is exposed. In this case, some Sb atoms diffuse from the Sb layer below the SiO$_2$ film 4 into the highly doped n-type GaAs layer 2 or the SiO$_2$ film 4. No problem occur since Sb which is a V group element is electrically inactive in III-V compound semiconductors. Thereafter, an n-type impurity doped GaAs layer (Si impurity concentration:$5 \times 10^{16}$ cm$^{-3}$; the forbidden band:1.439 eV at room temperature) is selectively epitaxially grown on the area with the SiO$_2$ film removed by the known technique (FIG. 1C).

Figure 1D:
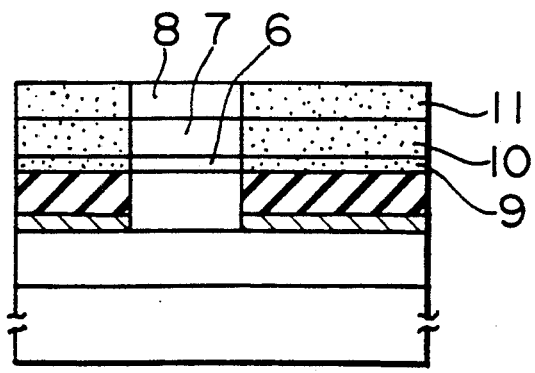

The usual epitaxial growth with no selectivity is carried out in the same apparatus for MOCVD for a highly-doped p-type Al$_x$Ga$_{1-x}$As layer 6 (x:0.1 to 1; the forbidden band:1.439 eV to 1.548 eV, the film thickness:500 Å; the Be impurity concentration: $2 \times 10^{19}$ cm$^{-3}$), an n-type impurity doped Al$_{0.3}$Ga$_{0.7}$As layer 7 (the film thickness:1500 Å; the forbidden band:1.749 eV), and a highly doped n-type GaAs layer 8 (the film thickness:2000 Å). Otherwise, after the above n-type impurity doped GaAs layer 5 has been formed, the sample may be shifted to an apparatus for molecular beam epitaxy (MBE). In this case, the Sb layer is deposited on the layer 5 in the apparatus for MOCVD, and is removed in the apparatus for MBE. Then the epitaxial growth is carried out for the highly-doped p-type Al$_x$Ga$_{1-x}$As layer 6, an n-type impurity doped Al$_{0.3}$Ga$_{0.7}$As layer 7, and the highly doped n-type GaAs layer 8. In both methods the corresponding polycrystalline semiconductor layers 9, 10 and 11 are formed on the SiO$_2$ layer 4. If the film of crystal of CaF$_2$, SrF$_2$, BaF$_2$ or their alloy is used instead of the SiO$_2$ film, single-crystalline semiconductor layers can be formed on such an insulator film (FIG. 1D).

By etching the n-type doped polycrystalline Al$_{0.3}$Ga$_{0.7}$As layer 10, the highly doped n-type polycrystalline GaAs layer 11 and the highly doped p-type Al$_x$Ga$_{1-x}$As layer 9 and the SiO$_2$ film, using a photoresist film (not shown) having a desired pattern as a mask, the surface of the highly-doped p-type Al$_x$Ga$_{1-x}$As layer 9 and the surface of part of the Sb layer 3 where a collector electrode is to be formed are exposed (FIG. 1E).

Side walls 12 of insulator e.g. SiO$_2$ are formed by the known technique. After the Sb layer within the recessed portion where the collector electrode is to be formed is removed, a highly doped n-type GaAs film 13 having a thickness of 4500 Å is selectively epitaxially grown there. In this case, the metal such as W may be embedded in the recessed portion. Finally, respective electrodes 14, 15 and 16 of an emitter, a base, and a collector are formed.

Incidentally, although in this embodiment, the Al$_{0.3}$Ga$_{0.7}$As layer 7 is used for the emitter, the other alloy composition may be adopted. The material of the insulator layer may not be SiO$_2$, but may be the other insulator such as Si$_3$N$_4$. Further, the combination of materials other than GaAs/AlGaAs may be used for the fabricating process of a semiconductor device having a heterojunction.

In accordance with this embodiment, the insulator is embedded between the highly doped p-type polycrystalline Al$_x$Ga$_{1-x}$As layer 9 and the highly doped n-type GaAs layer 2 so that the base-collector capacitance is remarkably reduced. Thus, very high speed heterojunction bipolar transistors can be realized.

Furthermore, in a collector-top-type heterojunction bipolar transistor in which the n-type impurity doped GaAs layer 5 and the Al$_{0.3}$Ga$_{0.7}$As layer 7 are replaced by each other in their position, reduction in the current gain which had been problematic was not observed. Thus, its performance can be more remarkably enhanced.

EMBODIMENT 2

FIGS. 2A to 2e show the sectional structures in the process for fabricating a very thin film base hetero-junction bipolar transistor according to the second embodiment of the present invention.

Figure 2A:
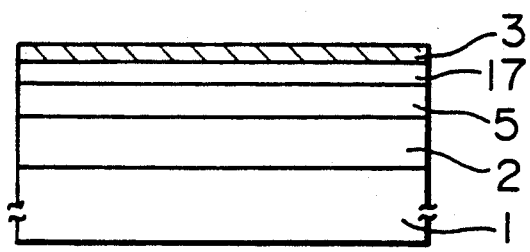
FIG. 2A to 2E are sectional views of the steps in a method for fabricating a very-thin-film-base hetero-junction bipolar transistor according to the second embodiment of the present invention.
Figure 2E:
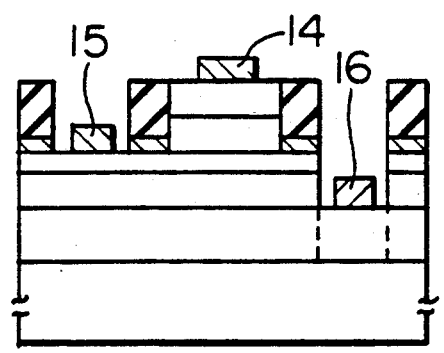

First, formed on a semi-insulative GaAs substrate 1 at the temperature of about 600° C. by the molecular beam epitaxy are a highly doped n-type GaAs layer 2, an n-type doped GaAs layer 5, and a very thin (500 Å or less, now 200 Å) film p-type Al$_x$Ga$_{1-x}$As layer 17 (C or Be impurity concentration:$1 \times 10^{20}$ cm$^{-3}$). Deposited thereon at the lowered growing temperature is a Sb layer 3 (FIG. 2A).

Figure 2B:
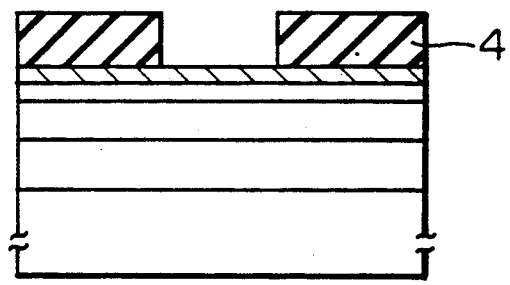

An SiO$_2$ film 4 is deposited. The deposited SiO$_2$ film 4 is etched using, as a mask, the resist pattern (not shown) having a desired pattern to remove part of the SiO$_2$ film 4 where a transistor is to be formed thereby to expose the surface of the Sb layer 3 (FIG. 2B).

Figure 2C:
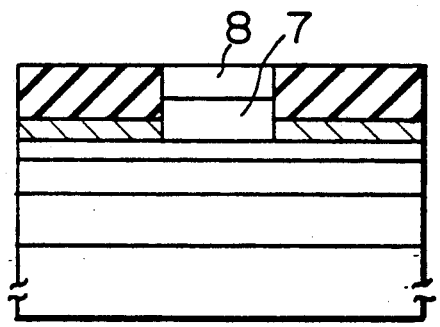

The sample is accommodated in an apparatus for metal organic chemical vapor deposition (MOCVD) and heated at the temperature of 560° C. or so to evaporate part of the Sb layer 3 the surface of which is exposed. Selectively epitaxially grown on the p-type Al$_x$Ga$_{1-x}$As layer 17 thus exposed are an n-type doped Al$_{0.3}$Ga$_{0.7}$As layer 7 and a highly doped n-type GaAs layer 8 (FIG. 2C).

Figure 2D:
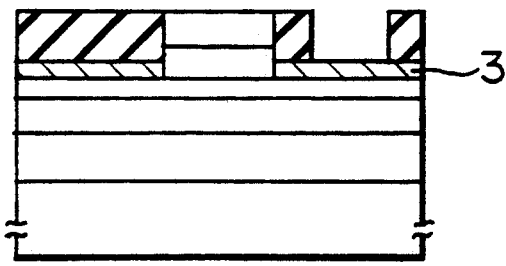

The SiO$_2$ film 4 is etched using as a mask the resist film (not shown) having a desired pattern to remove part thereof at area where a collector electrode is to be formed, thus exposing the corresponding part of the surface of the Sb layer 3 (FIG. 2D).

The part of the Sb layer 3 at the area at issue is evaporated by rising the temperature. Further, the corresponding parts of the highly doped p-type Al$_x$Ga$_{1-x}$As layer 17 and the n-type doped GaAs layer 5 are etched away. Thereafter, part of the SiO$_2$ film 4 at the area where a base electrode is to be formed is etched away, and the corresponding part of the Sb layer 3 is evaporated by rising the temperature. Finally, respective electrodes 14, 15 and 16 for an emitter, a base and a collector are formed (FIG. 2C).

In accordance with this embodiment, the Sb layer 3 serves as an etching stopper so that the p-type Al$_x$Ga$_{1-x}$As 17 will not be etched. The surface of the layer 17 can be surely exposed at the area where the base electrode is to be formed, i.e. external base area, to form the base electrode 15. Such a technique has more improved reproducibility than the conventional technique in which the surface of the external base area is exposed by etching. Further, there is no fear of increasing the external base resistance between the base electrode and the base so that the base can be formed as a very thin film. Additionally, the concept of this embodiment can be combined with the method of embedding the insulator films in the first embodiment to fabricate a heterojunction bipolar transistor with a more excellent performance of operation at a higher speed.

EMBODIMENT 3

FIGS. 3A to 3D show the sectional structures in the process of fabricating a field effect transistor according to the third embodiment of the present invention.

Figure 3A:
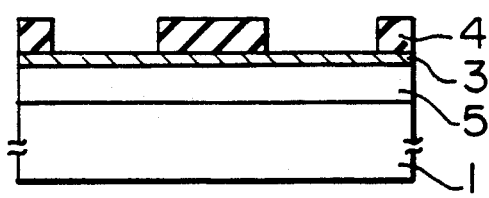
FIG. 3A to 3D are sectional views of the steps of a method for fabricating field effect transistor (FET) according to the third embodiment of the present invention.

First, an n-type doped GaAs layer 5 is epitaxially grown on a semi-insulative GaAs substrate 1, and an Sb layer is deposited thereon. An $SiO_2$ film 4 is further deposited thereon. The $SiO_2$ film 4 thus formed is etched using as a mask the resist film (not shown) to remove parts thereof at the areas where source and drain electrodes are to be formed (FIG. 3A).

Figure 3B:
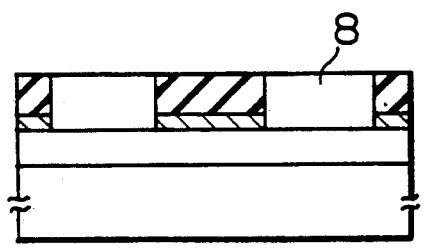

The substrate is heated within an apparatus for metal organic chemical vapor deposition (MOCVD) to evaporate part of the Sb layer 3 at the area at issue. Thereafter, a highly doped n-type GaAs layer 8 is selectively epitaxially grown on the exposed part of the GaAs layer 5 (FIG. 3B).

Figure 3C:
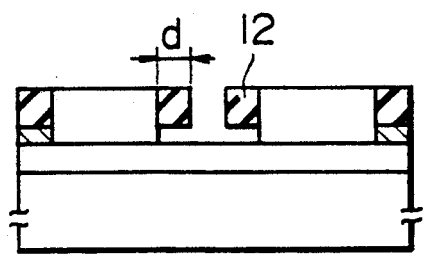

Part of the $SiO_2$ film 4 at the area where a gate electrode is to be formed is etched away. Thereafter, side walls 12 of $SiO_2$ are formed within the recessed portion thus formed by the known technique, and part of the Sb layer 3 at the area at issue (including the part below the side walls) is evaporated (FIG. 3C). With the thickness of the Sb film of 500 Å, if the film thickness d of the side walls is smaller than 2000 Å or so, part of the Sb film 3 below the side walls can be removed so that the gate electrode will not be short-circuited with a source or drain region. Finally, respective electrodes 18, 19 and 20 for the gate, source and drain are formed. Incidentally, it should be noted that hollows are formed below the side walls.

In accordance with this embodiment, the crystalline quality of interfaces between the n-type doped GaAs layer 5 which constitutes a channel and the highly doped n-type GaAs layer 8 which constitutes source and drain regions can be improved (This is particularly important for the field effect transistor which is fabricated using the selective epitaxial growth). Thus, a field effect transistor (FET) with an excellent performance can be provided.

EMBODIMENT 4

FIGS. 4A to 4D show the sectional structures in the process for fabricating a permeable base transistor according to the fourth embodiment of the present invention.

Figure 4A:
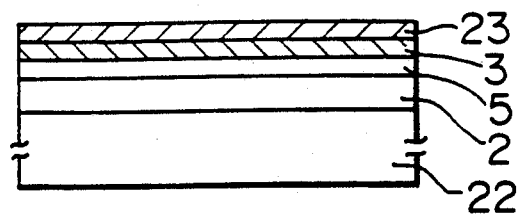
FIG. 4A to 4D are sectional views of the steps of a method for fabricating a permeable base transistor according to the fourth embodiment of the present invention.

First, successively epitaxially grown on a highly doped n-type GaAs layer at the temperature of 600° C. or so by the molecular beam epitaxy are a highly doped n-type GaAs layer 2 (5000 Å thick) and an n-type doped GaAs layer 5 (1000 Å thick). An Sb film 3 (500 Å thick) is deposited thereon at the growing temperature lowered to 150° C. Thereafter, a tungsten (W) film 23 (1000 Å thick) is further deposited thereon (FIG. 4A).

Figure 4B:
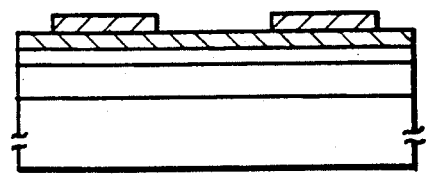

The usual lithography step and etching step are carried out to form base electrodes of the W film (FIG. 4B).

Figure 4C:
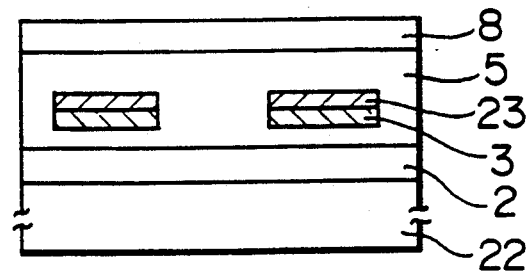
Figure 3D:
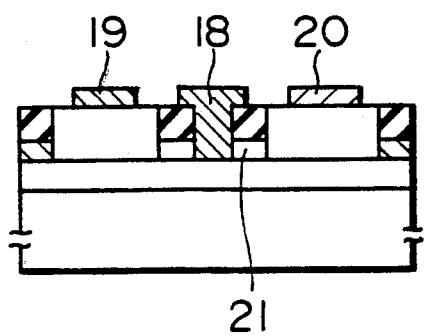

The substrate is heated in an apparatus for MOCVD to evaporate part of the Sb layer the surface of which is exposed. Thereafter, the n-type doped GaAs layer 5 is epitaxially grown again so as to embed the W base electrodes therein. A highly doped n-type GaAs layer 8 (2000 Å thick) is further deposited thereon (FIG. 4C).

Figure 4D:
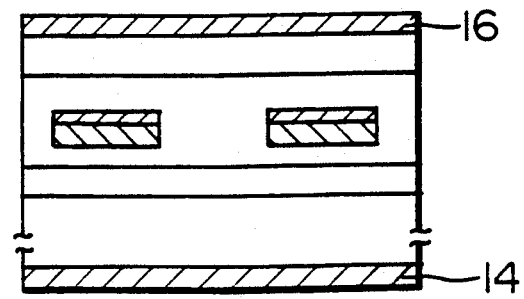

Finally, electrodes 14 and 16 for an emitter and a collector are formed (FIG. 4D).

In this embodiment, the Sb film 3 is left below the W base electrodes, but this does not influence the operation of the permeable base transistor. Further, although w is used for the base electrodes, the other metal may be adopted.

In accordance with this embodiment, the crystal quality of interfaces between the grown GaAs layers after the regrowth thereof of embedding the W base electrodes therein can be greatly improved as compared with the conventional technique using no Sb film. Thus, the permeable base transistor with a more excellent performance can be provided.

As understood from the explanation hitherto made, the surface protection layer having Sb as its main component has so high an evaporation speed that no strain nor defect is given to the underlying semiconductor material; the regrowth of semiconductors does not lower the fabrication efficiency and yield rate of semiconductor devices. Thus, in accordance with the present invention, a semiconductor device with an excellent crystalline quality of interfaces can be provided.

Further, by selectively removing the surface protection layer used in regrowing a semiconductor layer, an insulator film or metallic film can be embedded, which was difficult. In the conventional technique in which the semiconductor layers are successively grown. Thus, in accordance with the present invention, freedom of designing semiconductor devices can be enhanced thereby to improve their performance.

We claim:

1. A method for fabricating a semiconductor device comprising the steps of:
   forming at least, the first semiconductor layer on a semiconductor substrate;
   forming a surface protection layer of antimony (Sb) or the material having Sb as its main component on said first semiconductor layer;
   forming a film having a predetermined opening pattern on said surface protection film;
   removing said surface protection film thus exposed;
   forming the second semiconductor layer on at least said first semiconductor layer thus exposed;
   forming the third semiconductor layer on at least said second semiconductor layer;
   etching a predetermined area to expose at least said first semiconductor layer; and
   forming electrodes on predetermined areas of said first semiconductor layer thus exposed and said third semiconductor layer.

2. A method for fabricating a semiconductor device according to claim 1, wherein said first and second semiconductor layers are made of single-crystalline semiconductor.

3. A method for fabricating a semiconductor device according to claim 1, wherein said surface protection film is removed by heating it at 560° C. or higher.

4. A method for fabricating a semiconductor device according to claim 1, wherein said film having an opening pattern is one selected from the group consisting of $SiO_2$, $CaF_2$, $BaF_2$ and W.

5. A method for fabricating a semiconductor device according to claim 1, wherein said first, second and third semiconductor layers are made of the first semiconductor having the first conduction type, comprising, between the step of forming said second semiconductor layer and the step of said third semiconductor layer, the steps of forming, on at least said second semiconductor layer, the fourth semiconductor layer of the first semiconductor having the second conduction type different from the first conduction type, and forming on said fourth semiconductor layer the fifth semiconductor layer of the second semiconductor having the first conduction type and a band gap different from that of said first semiconductor; and further comprising the steps of;

after having formed said third semiconductor layer on said fifth semiconductor layer, etching a predetermined area to expose said fourth semiconductor layer; and forming an electrode on a predetermined area of said fourth semiconductor layer thus exposed.

6. A method for fabricating a semiconductor device according to claim 5, wherein said fourth semiconductor layer is made of third semiconductor having a band gap intermediate between those of said first semiconductor and said second semiconductor.

7. A method for fabricating a semiconductor device according to claim 5, further comprising the step of:

covering the side walls of said semiconductor layers exposed by the etching with insulating films.

8. A method for fabricating a semiconductor device according to claim 5, further comprising the step of forming, sixth semiconductor layer of the first semiconductor having the first conduction layer after having formed said third semiconductor layer on said fifth semiconductor layer and etched a predetermined area to expose said first semiconductor layer.

9. A method for fabricating a semiconductor device according to claim 5, wherein said first, second and third semiconductor are single crystal of III–V compound semiconductor or its alloy.

10. A method for fabricating a semiconductor device according to claim 5, wherein said second semiconductor layer has a thickness substantially equal to that of said film having an opening pattern.

11. A method for fabricating a semiconductor device according to claim 1, wherein said first and third semiconductor layers are made of the first semiconductor having the first conduction type, and said second semiconductor layer is made of the second semiconductor having the first conduction type and a band gap different from that of said first semiconductor, comprising between the step of forming said first semiconductor layer and the step of forming said surface protection film, the steps of:

forming, on said first semiconductor layer, the fourth semiconductor layer having the first conduction type; and forming, on said fourth semiconductor layer, the fifth semiconductor layer made of the first semiconductor having the second conduction type different from the first conduction type, and further comprising the steps of:

after having formed said third semiconductor layer on said second semiconductor layer, etching a predetermined area to expose said fifth semiconductor layer; and forming an electrode on a predetermined area of said fifth semiconductor layer thus exposed.

12. A method for fabricating a semiconductor device according to claim 11, wherein said fifth semiconductor layer is made of third semiconductor having a band gap intermediate between those of said first semiconductor and said second semiconductor.

13. A method of fabricating a semiconductor device according to claim 11, wherein said first, second and third semiconductor layers are single-crystal of III–V compound semiconductor and its alloy.

14. A method for fabricating a semiconductor device according to claim 11, wherein said first semiconductor layer is more highly doped than said fourth semiconductor layer.

15. A method for fabricating a semiconductor device according to claim 11, wherein the sum of the thicknesses of said second and third semiconductor layers is substantially equal to the thickness of said film having a predetermined opening.

16. A method for fabricating a semiconductor device according to claim 1, wherein said first, second and third semiconductor layers are made of the first semiconductor layer having the first conduction type, further comprising, between the step of forming said first semiconductor layer and the step of forming said surface protection layer, the step of forming, on said first semiconductor layer, the fourth semiconductor layer having the first conduction type.

17. A method for fabricating a semiconductor device comprising the steps of:

forming at least the first semiconductor layer on a semiconductor substrate;

forming, on said first semiconductor layer, a surface protection layer of Sb or the material having Sb as its main component;

forming, on said surface protection layer, a film having a predetermined opening pattern;

removing said surface protection layer thus exposed;

forming, on at least said first semiconductor layer thus exposed, the second semiconductor layer;

etching a predetermined area to expose said first semiconductor layer; and forming electrodes on predetermined areas of said first and second semiconductor layers thus exposed.

18. A method for fabricating a semiconductor device according to claim 17, wherein said opening pattern has a pair of openings spaced apart from each other, and said predetermined area for which the etching is to be made resides between said pair of openings.

19. A method for fabricating a semiconductor device according to claim 17, wherein said first and second semiconductor layers are single-crystal of III–V compound semiconductor and its alloy.

20. A method for fabricating a semiconductor device comprising the steps of:

forming at least the first semiconductor layer on one main surface of a semiconductor substrate;

forming, on said first semiconductor layer, a surface protection layer of Sb or the material having Sb as its main component;

forming, on said surface protection layer, a film having a predetermined opening pattern;

removing said surface protection layer thus exposed;

forming, on at least said first semiconductor layer thus exposed, the second semiconductor layer; and forming electrodes on predetermined areas of the other main surface of said semiconductor substrate and said second semiconductor layer.

21. A method for fabricating a semiconductor device according to claim 20, wherein said semiconductor substrate, and said first and second semiconductor layers are single-crystal of III–V compound semiconductor and its alloy.

22. A method for fabricating a semiconductor device according to claim 20, wherein said film having a predetermined opening pattern is made of metal.

23. A method for fabricating a semiconductor device according to claim 22, wherein said metal is tungsten (W).

* * * * *

UNITED STATES PATENT AND TRADEMARK OFFICE
CERTIFICATE OF CORRECTION

PATENT NO.  : 5,017,517
DATED       : May 21, 1991
INVENTOR(S) : Kazuhiro Mochizuki, et al.

It is certified that error appears in the above-identified patent and that said Letters Patent is hereby corrected as shown below:

| Column | Line | Corrections |
|--------|------|-------------|
| 1 | 30 | After "disclosed" delete "is". |
| 1 | 31 | After "62-49659" insert --is--. |
| 1 | 42 | After "However" insert --,--. |
| 2 | 54 | After "such" change "a" to --as--. |
| 3 | 14 | Change "occur" to --occurs--. |
| 4 | 45 | After "at" insert --the--. |
| 6 | 29 | After "difficult" delete ". In" and insert --in--. |
| 7 | 21 | Before "third" insert --a--. |
| 7 | 31 | After "forming" delete "," and insert --a--. |
| 8 | 3 | Before "third" insert --a--. |

Signed and Sealed this

Twenty-seventh Day of October, 1992

Attest:

DOUGLAS B. COMER

*Attesting Officer*         *Acting Commissioner of Patents and Trademarks*